US012690121B2

(12) United States Patent
Han

(10) Patent No.: US 12,690,121 B2
(45) Date of Patent: Jul. 21, 2026

(54) CAMERA MODULE

(71) Applicant: LG INNOTEK CO., LTD., Seoul (KR)

(72) Inventor: Sang Yeal Han, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 128 days.

(21) Appl. No.: 18/575,572

(22) PCT Filed: Jul. 1, 2022

(86) PCT No.: PCT/KR2022/009561
§ 371 (c)(1),
(2) Date: Dec. 29, 2023

(87) PCT Pub. No.: WO2023/277668
PCT Pub. Date: Jan. 5, 2023

(65) Prior Publication Data
US 2024/0314922 A1     Sep. 19, 2024

(30) Foreign Application Priority Data

Jul. 2, 2021    (KR) ........................ 10-2021-0087298

(51) Int. Cl.
*H05K 1/02*         (2006.01)
*H04N 23/54*        (2023.01)
(52) U.S. Cl.
CPC .......... *H05K 1/0215* (2013.01); *H04N 23/54* (2023.01)
(58) Field of Classification Search
None
See application file for complete search history.

(56) References Cited

U.S. PATENT DOCUMENTS

| | | | |
|---|---|---|---|
| 6,518,864 B1 | 2/2003 | Ito et al. | |
| 2014/0132768 A1 | 5/2014 | Choi et al. | |
| 2015/0015778 A1 | 1/2015 | Lee | |
| 2019/0028620 A1 | 1/2019 | Park | |
| 2019/0373142 A1* | 12/2019 | Fujiwara | H04N 23/54 |
| 2020/0053258 A1 | 2/2020 | Park et al. | |

(Continued)

FOREIGN PATENT DOCUMENTS

| | | |
|---|---|---|
| EP | 2136552 | 12/2009 |
| EP | 3346692 | 7/2018 |
| JP | 2008-263550 | 10/2008 |

(Continued)

OTHER PUBLICATIONS

Bandai (JP-2018098660-A) (Year: 2016).*

(Continued)

*Primary Examiner* — Hung S. Bui
*Assistant Examiner* — Elisa Sasserath
(74) *Attorney, Agent, or Firm* — KED & ASSOCIATES, LLP

(57) ABSTRACT

A camera module comprises: a first body comprising a lens; a second body coupled to the first body; and a printed circuit board disposed between the first body and the second body. The first body comprises a first guide protruding downward and comprising a first protrusion. The printed circuit board comprises a first guide hole to which the first protrusion is coupled. The first guide is soldered to the first guide hole.

16 Claims, 8 Drawing Sheets

(56) References Cited

U.S. PATENT DOCUMENTS

2020/0292918 A1 * 9/2020 Park ......................... H05B 3/84

FOREIGN PATENT DOCUMENTS

| JP | 2018-098660 | | 6/2018 | |
| JP | 2018098660 | A * | 6/2018 | |
| JP | 2019-537317 | | 12/2019 | |
| JP | 2020-525840 | | 8/2020 | |
| KR | 20090108213 | A * | 10/2009 | .............. A47C 7/46 |
| KR | 10-1022870 | | 3/2011 | |
| KR | 10-2016-0104316 | | 9/2016 | |
| KR | 10-2017-0027073 | | 3/2017 | |
| KR | 20170027073 | A * | 3/2017 | ............. H04N 23/54 |
| KR | 10-2018-0118459 | | 10/2018 | |
| KR | 20190004457 | | 1/2019 | |
| KR | 20190004457 | A * | 1/2019 | ........... H04N 5/2254 |
| KR | 20210057414 | | 5/2021 | |
| KR | 20210057414 | A * | 5/2021 | ............. H04N 23/51 |

OTHER PUBLICATIONS

Jonghyun et. al (KR-20210057414-A) (Year: 2021).*
Han Sang Yeal (KR 20190004457 A) (Year: 2019).*
Ahn et. al (KR-20170027073-A) (Year: 2017).*
Lee (KR 20090108213 A) (Year: 2009).*
International Search Report dated Oct. 7, 2022 issued in Application No. PCT/KR2022/009561.
Extended European Search Report dated Apr. 28, 2025, issued in Application No. 22833721.8.
Japanese Office Action dated Feb. 3, 2026 issued in Application No. 2024-500084.

* cited by examiner

【FIG. 1】
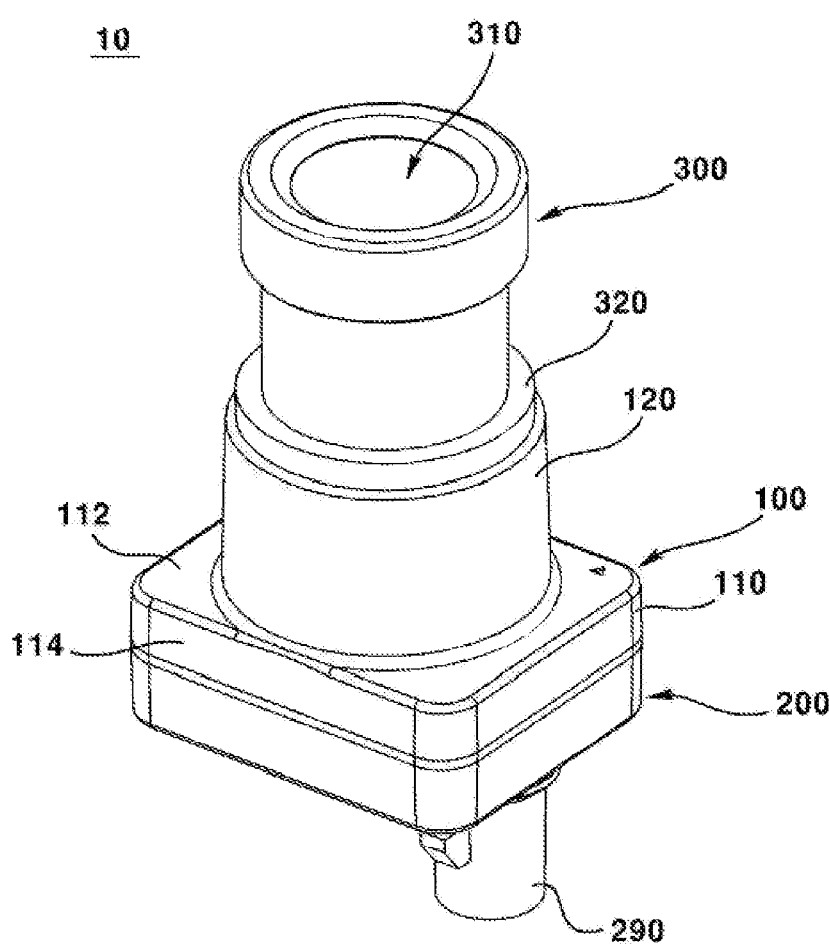

【FIG. 2】
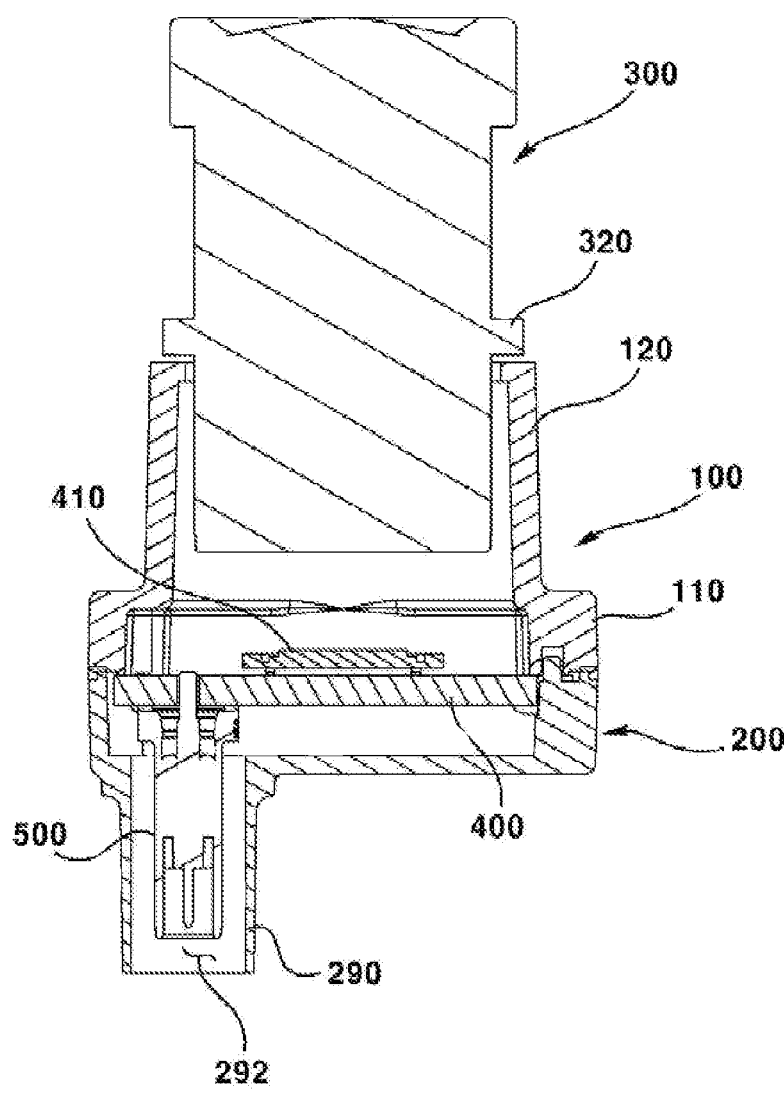

【FIG. 3】
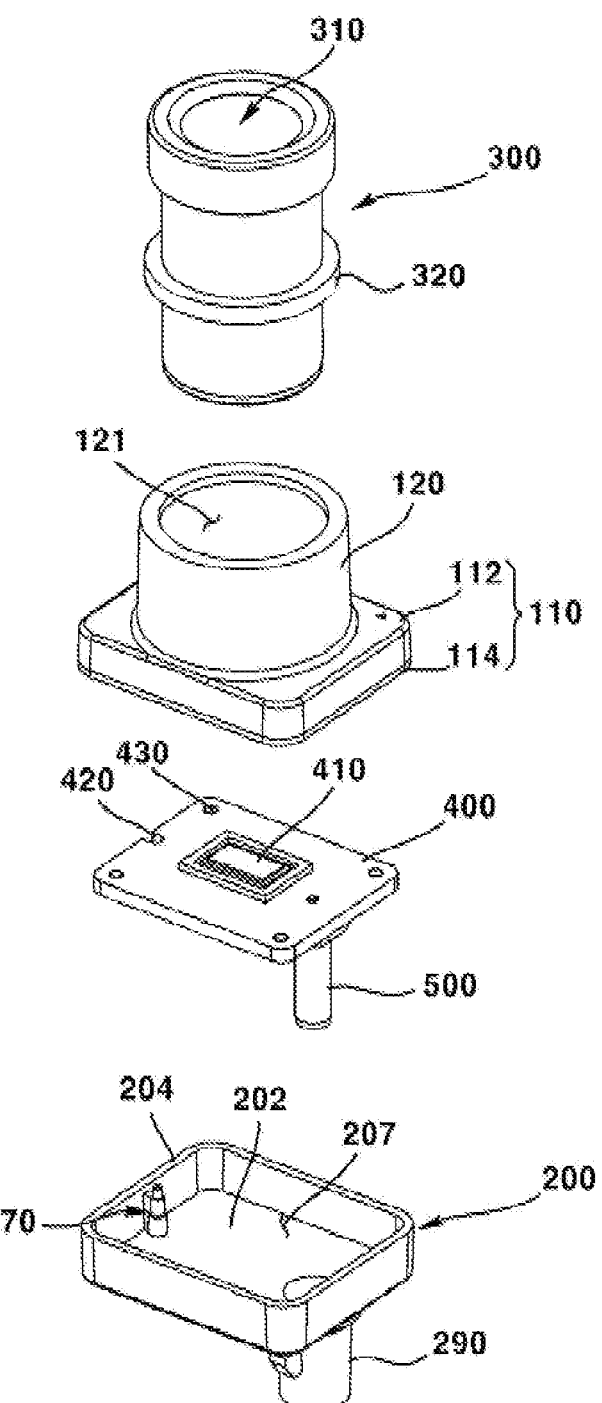

【FIG. 4】
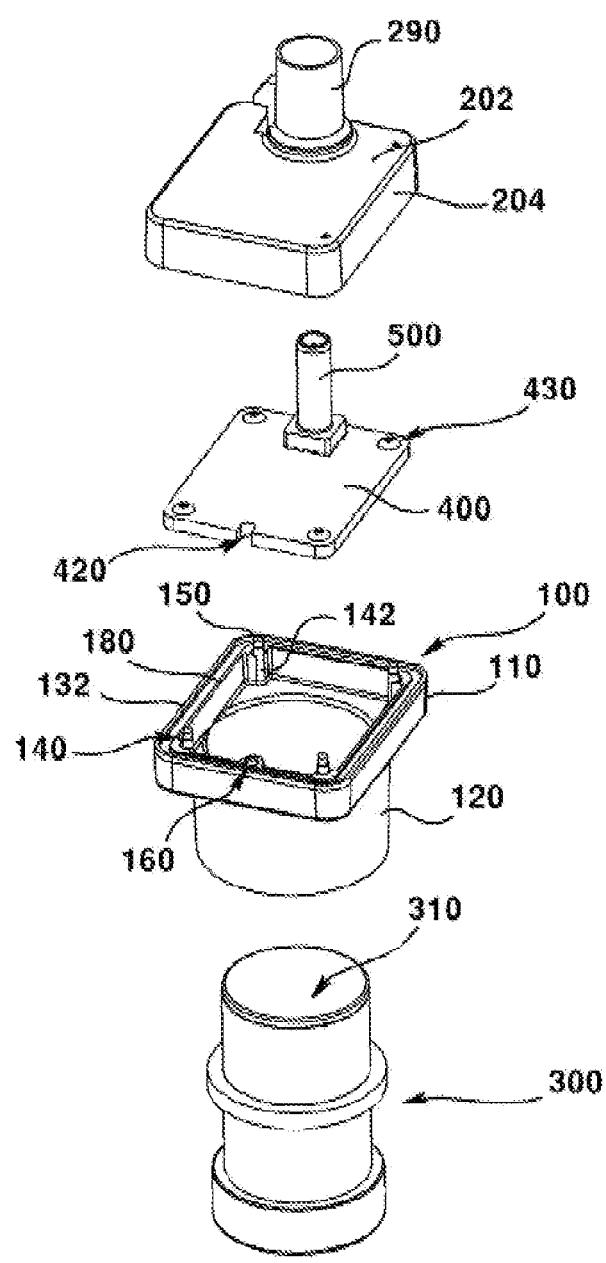

【FIG. 5】
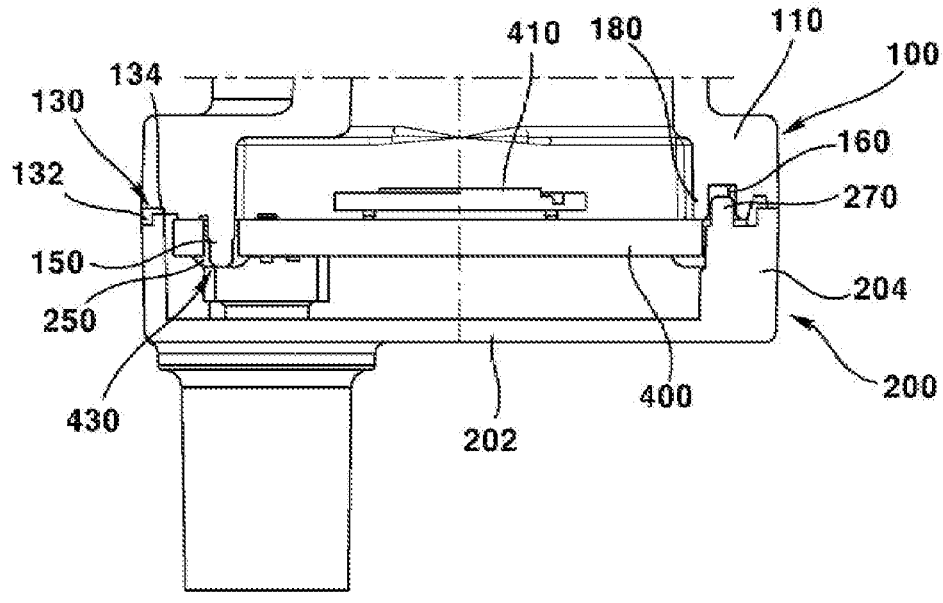
【FIG. 6】
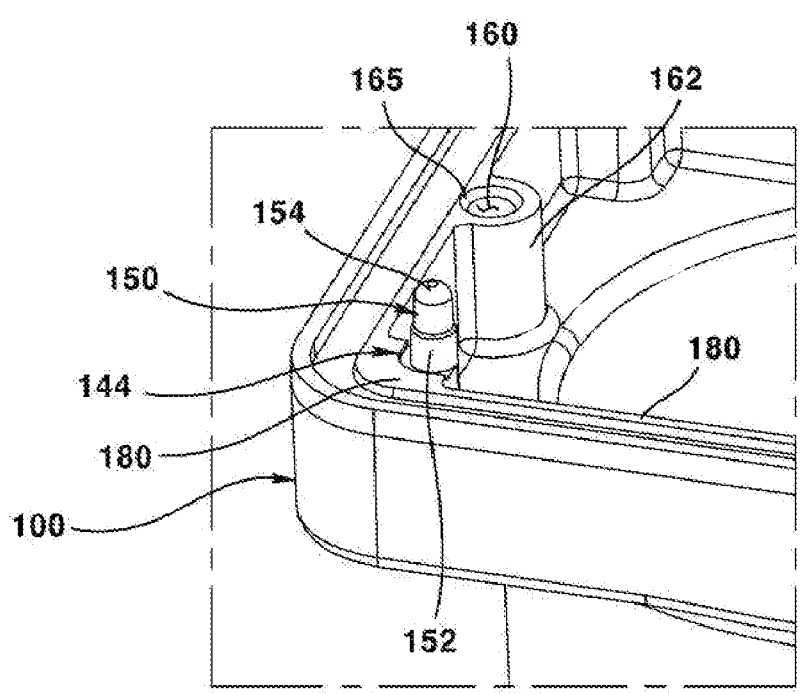

【FIG. 7】
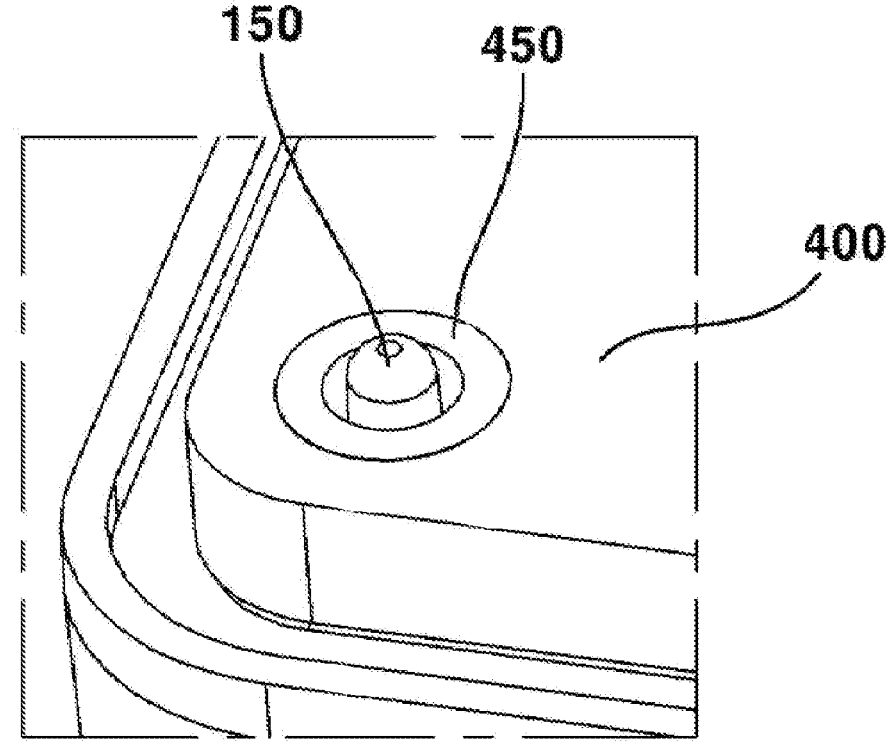
【FIG. 8】
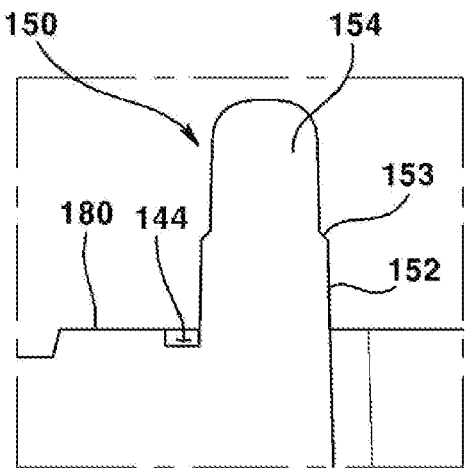

【FIG. 9】
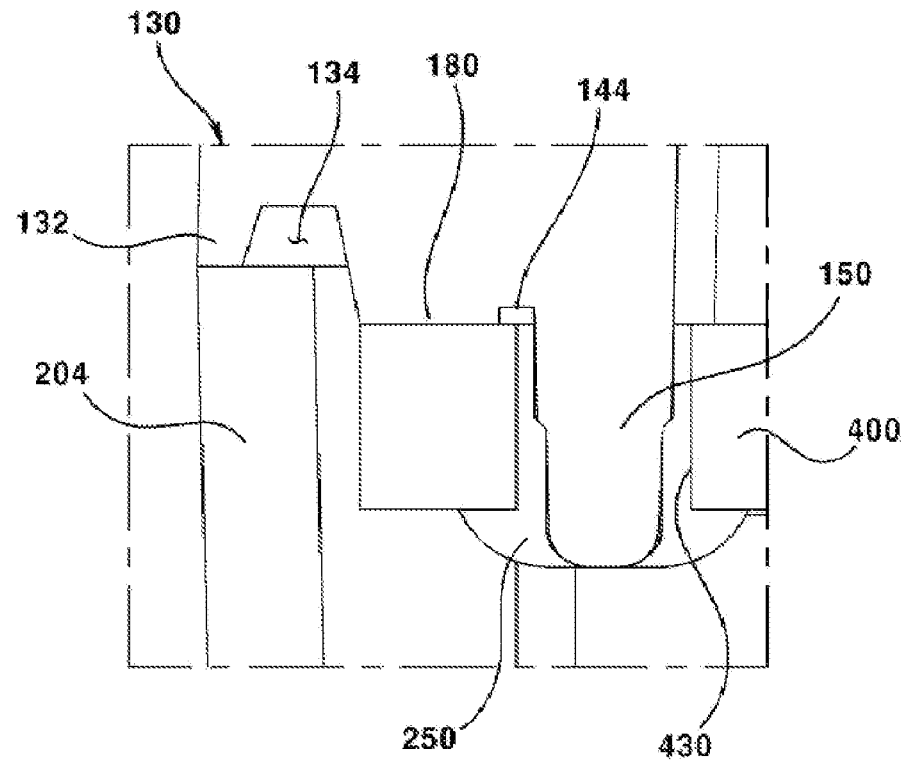

【FIG. 10】
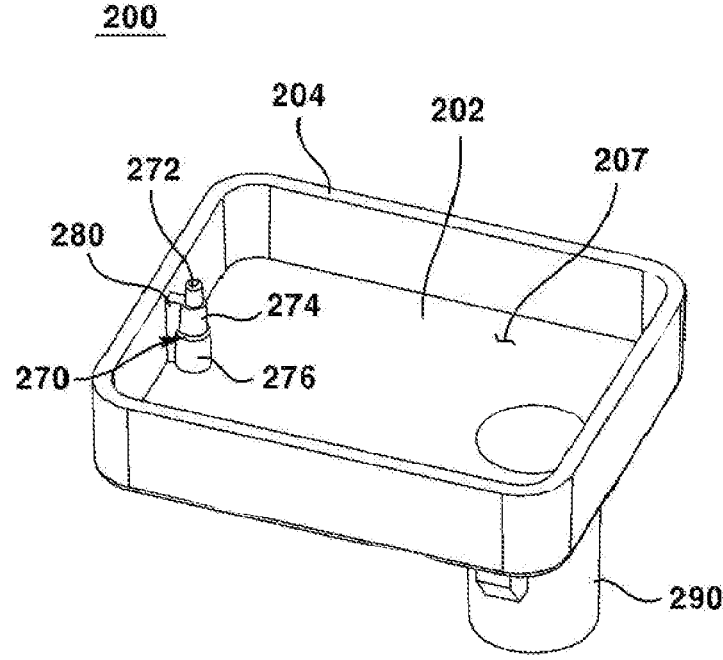
【FIG. 11】
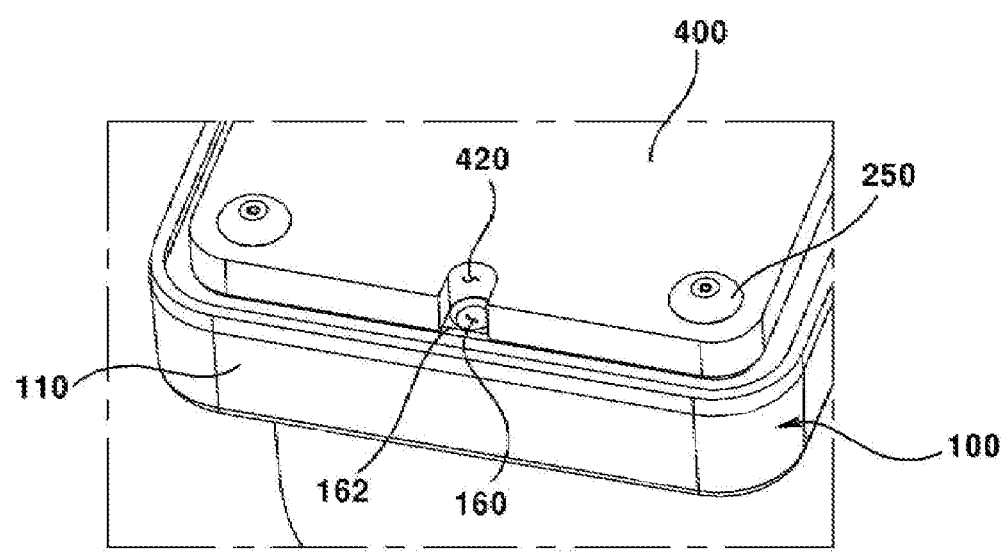

CAMERA MODULE

CROSS-REFERENCE TO RELATED PATENT APPLICATIONS

This application is a U.S. National Stage Application under 35 U.S.C. § 371 of PCT Application No. PCT/KR2022/009561, filed Jul. 1, 2022, which claims priority to Korean Patent Application No. 10-2021-0087298, filed Jul. 2, 2021, whose entire disclosures are hereby incorporated by reference.

TECHNICAL FIELD

The teachings in accordance with exemplary and non-limiting embodiments of this invention relate generally to a camera module.

BACKGROUND ART

In recent years, subminiature camera modules have been developed, and subminiature camera modules are widely used in small electronic products such as smartphones, laptops, game consoles, etc. With the popularity of automobiles, subminiature cameras are not only used in small electronic products, but also in vehicles. For example, subminiature cameras are used as black box cameras for vehicle protection or objective data of traffic accidents, rear view cameras that allow the driver to monitor the blind spots at the rear of the vehicle through the screen to ensure safety when reversing, and perimeter detection cameras that can monitor the surroundings of the vehicle.

The camera may include a lens, a lens holder for receiving the lens, an image sensor for converting an image of a subject gathered by the lens into an electrical signal, and a printed circuit board on which the image sensor is mounted. A housing forming the exterior of the camera may have an enclosed structure throughout to prevent contamination of the internal components with foreign matter, including moisture.

DETAILED DESCRIPTION OF INVENTION

Technical Subject

It is an object of the present exemplary embodiment to provide a camera module whose structure can be improved to reduce the manufacturing cost by reducing the number of components, and to protect the components within the module from external impact.

Technical Solution

A camera module according to an exemplary embodiment may comprise:
a first body including a lens; a second body coupled to the first body; and a printed circuit board interposed between the first body and the second body, wherein the first body may include a first guide projecting downwardly and include a first projection, and wherein the printed circuit board may include a first guide hole into which the first projection is coupled, and wherein the first guide may be soldered to the first guide hole.

Preferably, but not necessarily, the first protrusion may include a first region having a first diameter and a second region having a second diameter smaller than the first diameter, and a region between the first region and the second region may be disposed on an inner side of the first guide hole.

Preferably, but not necessarily, an inclined region may be disposed between the first region and the second region.

Preferably, but not necessarily, the first guide and the first guide hole may each be provided in plurality, and may be disposed in each corner region of the first body and the printed circuit board.

Preferably, but not necessarily, the first body may include a second protrusion projecting downwardly and contacting a top surface of the printed circuit board.

Preferably, but not necessarily, an escape groove may be disposed between the second protrusion and the first guide, which may be more recessed than in other areas.

Preferably, but not necessarily, the first body may include a second guide projecting downwardly and having a coupling groove formed in its center, and the second body may include a third guide projecting upwardly and engaging the second guide.

Preferably, but not necessarily, a second guide hole may be disposed on the printed circuit board facing the second guide and the third guide in which the second guide or the third guide is engaged.

Preferably, but not necessarily, an epoxy may be disposed between the lower surface of the first body and the upper surface of the second body.

A camera module according to another exemplary embodiment may comprise: a first body including a top plate and a first side plate projecting downwardly from an edge of the top plate;
a second body including a bottom plate and a second side plate projecting upwardly from an edge of the bottom plate; and
a printed circuit board disposed in a space within the second body, the first body including a first guide projecting downwardly from an edge of the top plate, the printed circuit board including a first guide hole of a ground power source to which the first guide is coupled, and the first guide being soldered to the first guide hole.

Advantageous Effect

Through the given exemplary embodiment, the first body, second body, and printed circuit board are electrically connected to form a ground region, so that electromagnetic waves generated in the circuit region of the printed circuit board can be prevented from radiating outward and affecting adjacent electronic components, or from entering the printed circuit board, thereby further improving the electrical characteristics of the camera module and preventing the inclusion of noise in the electrical signals, resulting in superior quality images.

Furthermore, the printed circuit board and the first body are joined by soldering, thereby providing an advantage of reducing the manufacturing cost by reducing the number of components.

BRIEF DESCRIPTION OF DRAWINGS

FIG. 1 is a perspective view illustrating the appearance of a camera module according to an exemplary embodiment of the present invention.

FIG. 2 is a cross-sectional view of a camera module according to an exemplary embodiment of the present invention.

FIG. 3 is an exploded perspective view of a camera module according to an exemplary embodiment of the present invention.

FIG. 4 is a drawing illustrating FIG. 3 from another angle.

FIG. 5 is a cross-sectional view illustrating a combined structure of a first body, a second body, and a printed circuit board according to an exemplary embodiment of the present invention.

FIG. 6 is a perspective view illustrating a portion of one of the undersides of the first body in an exemplary embodiment of the present invention.

FIG. 7 is a perspective view illustrating the coupling structure of the first body and the printed circuit board, according to an exemplary embodiment of the present invention.

FIG. 8 is a cross-sectional view of a first guide according to an exemplary embodiment of the present invention.

FIG. 9 is a cross-sectional view illustrating a combined structure of a first guide and a printed circuit board according to an exemplary embodiment of the present invention.

FIG. 10 is a perspective view of the top surface of the second body according to an exemplary embodiment of the present invention.

FIG. 11 is a perspective view illustrating the coupling structure of the first body and the printed circuit board according to an exemplary embodiment of the present invention.

BEST MODE

Hereinafter, exemplary embodiments of the present invention will be described in detail with reference to the accompanying drawings.

However, the present invention is not limited to the given exemplary embodiments described, but may be implemented in a variety of different forms, and one or more of components among the exemplary embodiments may be optionally combined or substituted between embodiments within the scope of the present invention.

Furthermore, terms (including technical and scientific terms) used in the embodiments of the present invention, unless expressly specifically defined and described, are to be interpreted in the sense in which they would be understood by a person of ordinary skill in the art to which the present invention belongs, and commonly used terms, such as dictionary-defined terms, are to be interpreted in light of their contextual meaning in the relevant art.

Furthermore, the terms used in the embodiments of the invention are intended to describe the embodiments and are not intended to limit the invention. In this specification, the singular may include the plural unless the context otherwise requires, and references to "at least one (or more) of A and (or) B and C" may include one or more of any combination of A, B, and C that may be assembled.

In addition, the terms first, second, A, B, (a), (b), and the like may be used to describe components of embodiments of the invention. Such terms are intended only to distinguish one component from another, and are not intended to limit the nature or sequence or order of such components by such terms.

Furthermore, when a component is described as "connected," "coupled," or "attached" to another component, it can include cases where the component is "connected," "coupled," or "attached" to the other component directly, as well as cases where the component is "connected," "coupled," or "attached" to another component that is between the component and the other component.

Furthermore, when described as being formed or disposed "above" or "below" each component, "above" or "below" includes not only when two components are in direct contact with each other, but also when one or more other components are formed or disposed between the two components. Furthermore, when expressed as "above" or "below", it may include the meaning of upward as well as downward with respect to a single component.

FIG. 1 is a perspective view illustrating the appearance of a camera module according to an exemplary embodiment of the present invention, FIG. 2 is a cross-sectional view of a camera module according to an exemplary embodiment of the present invention, FIG. 3 is an exploded perspective view of a camera module according to an exemplary embodiment of the present invention, FIG. 4 is a drawing illustrating FIG. 3 from another angle, FIG. 5 is a cross-sectional view illustrating a combined structure of a first body, a second body, and a printed circuit board according to an exemplary embodiment of the present invention, FIG. 6 is a perspective view illustrating a portion of one of the undersides of the first body in an exemplary embodiment of the present invention, FIG. 7 is a perspective view illustrating the coupling structure of the first body and the printed circuit board, according to an exemplary embodiment of the present invention, FIG. 8 is a cross-sectional view of a first guide according to an exemplary embodiment of the present invention, FIG. 9 is a cross-sectional view illustrating a combined structure of a first guide and a printed circuit board according to an exemplary embodiment of the present invention, FIG. 10 is a perspective view of the top surface of the second body according to an exemplary embodiment of the present invention, and FIG. 11 is a perspective view illustrating the coupling structure of the first body and the printed circuit board according to an exemplary embodiment of the present invention.

Referring to FIGS. 1 to 11, the camera module (10) according to an exemplary embodiment of the present invention may be a vehicle camera module. The camera module (10) may be coupled to a vehicle. The camera module (10) may be used in one or more of a front camera, a side camera, a rear camera, and a black box of the vehicle. The camera module (10) may be disposed at the front of the vehicle. The camera module (10) may be disposed at the rear of the vehicle. The camera module (10) may be coupled to a windscreen of the vehicle. The camera module (10) may be coupled to the windscreen of the front or rear of the vehicle. The camera module (10) may be disposed on the side of a vehicle. The camera module (10) may photograph a subject and output an image to a display (not shown).

The camera module (10) may include a first body (100). The first body (100) may be referred to as a front body, an upper housing, or a first housing. The first body (100) may include a body portion (110). The first body (100) may include a barrel portion (120). The first body (100) may include a lens (300). The body portion (110), barrel portion (120), and lens (300) of the first body (100) may be integrally formed. Any two or more of the body portion (110), barrel portion (120), and lens (300) of the first body (100) may be integrally formed. In an exemplary embodiment, the body portion (110), the barrel portion (120), and the lens (300) may each be formed separately.

The body portion (110) may be coupled to the barrel portion (120). The body portion (110) may be integrally formed with the barrel portion (120). The body portion (110) may be formed of a metal material.

The body portion (110) may be disposed on the second body (200, described later). The body portion (110) may be coupled to the second body (200). A bottom end of the body portion (110) may be secured to the second body (200). The body portion (110) may be coupled to the second body (200) by an adhesive. The body portion (110) may be coupled to the printed circuit board (400, described later).

The body portion (110) may be formed as a rectangular shape with an opening at the bottom. In this case, the corners of the body portion (110) may be rounded. The body portion (110) may include a top plate (112) and a first side plate (114) extending from the top plate (112). The top plate (112) may be formed in a rectangular shape. The top plate (112) may extend outwardly from a lower outer peripheral surface of the barrel portion (120). A first side plate (114) may extend downwardly from an outer edge of the top plate (112). The first side plate (114) may include a plurality of plates. The first side plate (114) may include four side plates.

The first side plate (114) may be formed in the shape of a square plate. The first side plate (114) may include a first-1 side plate and a first-2 side plate, a first-3 side plate disposed opposite the first-1 side plate, and a first-4 side plate disposed opposite the first-2 side plate. The first side plate (114) may include first and fourth corners disposed among the first-1 to first-4 side plates, respectively. Each of the first to fourth corners may include a rounded shape in at least a portion.

On an inner side of the body portion (110), a space portion may be formed that is compartmentalized from other regions. The space portion may be open at the bottom and covered at the top by the barrel portion (120) and the lens (300).

The body portion (110) may include a first edge region (130) (see FIGS. 5 and 9). The first edge region (130) may be disposed on an outer side of the space portion. The first edge region (130) may form a bottom surface of the body portion (110).

The first edge region (130) may include a first protrusion (132), a second protrusion (180), and a first groove (134). Relative to the center of the body portion (110), the second protrusion (180) may be disposed on an inner side of the first protrusion (132), and the first groove (134) may be disposed between the first protrusion (132) and the second protrusion (180).

The first protrusion (132) may be formed to project downwardly from a bottom surface of the body portion (110) than other areas. A lower end of the first protrusion (132) may be disposed above a top surface of the printed circuit board (300). A bottom surface of the first protrusion (132) may contact a top surface of the second side plate (204) of the second body (200), as will be described later. A lower end of the first protrusion (132) may be disposed above a lower end of the second protrusion (180).

The second protrusion (180) may be disposed on an inner side of the first protrusion (132). A bottom side of the second protrusion (180) may be a bottom side of the first body (100). A bottom side of the second protrusion (180) may contact a top side of the printed circuit board (400). In other words, the underside of the first body (100) may contact the top surface of the printed circuit board (400). The bottom of the second protrusion (180) may project downwardly from the bottom of the first protrusion (132). A space portion may be formed on an inner side of the second protrusion (180). An inner surface of the second protrusion (180) may form an inner surface of the space portion.

The first groove (134) may be disposed between the first protrusion (132) and the second protrusion (180), and may have a shape that is more upwardly recessed than other regions. The first groove (134) may be arranged to at least partially overlap in an optical axis direction with the second side plate (204) of the second body (200). An inner surface of the first groove (134) may be formed with a slope such that the cross-sectional area of the first groove (134) narrows upwardly.

Between the first protrusion (132) and the top surface of the second side plate (204), the first groove (134) may have an adhesive member (not shown) disposed therein. The adhesive member may include an epoxy. Upon curing of the epoxy, the first body (100) and the second body (200) may be mutually bonded. In some cases, an adhesive member may be disposed between the second protrusion (180) and the printed circuit board (400), as well as on the side of the printed circuit board (400). Areas of the outer surface of the first body (100) other than the adhesive region where the adhesive member is disposed may be coated. In other words, a metal area of the first body (100) may be exposed to the outside through the bonding area.

The first body (100) may include a barrel portion (120). The barrel portion (120) may be a lens barrel. The barrel portion (120) may be formed of a metal material. The barrel portion (120) may be disposed on the body portion (110). The barrel portion (120) may extend from a top surface of the body portion (110). The barrel portion (120) may be integrally formed with the body portion (110). In a modification, the barrel portion (120) may be coupled to the body portion (110). In this case, the barrel portion (120) may be secured to the body portion (110) by an adhesive. The barrel portion (120) may accommodate a lens (300) therein. The barrel portion (120) may include a hole (121). The lens (300) may be disposed in the hole (121) of the barrel portion (120). The inner circumferential surface of the hole in the barrel portion (120) may be formed in a shape and size that corresponds to the outer circumferential shape of the lens (300).

The first body (100) may include a first guide (140). The first guide (140) may be formed to project downwardly from a bottom surface of the first body (100). The first guide (140) may project downwardly from a bottom surface of the top plate (112) and may be at least partially coupled to the printed circuit board (400).

Specifically, the first guide (140) may include a first guide body (142) projecting downwardly from a bottom surface of the top plate (112), and a first projection (150) projecting downwardly from a bottom surface of the first guide body (142). The first guide body (142) may have a shape that projects inwardly from an inner surface of the space within the first body (100). A bottom surface of the first guide body (142) may form a plane coincident with a bottom surface of the second protrusion (180).

The first projection (150) may project downwardly from a bottom surface of the first guide body (142). The cross-sectional area of the first projection (150) may be formed to be smaller than the cross-sectional area of the first guide body (142). A lower end of the first projection (150) may be disposed lower than a lower surface of the second projection (180). The first protrusion (150) may be coupled to the first guide hole (430) of the printed circuit board (400), which will be described later. The first protrusion (150) may be soldered to the first guide hole (430).

The first projection (150) may be circular in cross-section. The first projection (150) may include a first region (152) having a first diameter, and a second region (154) disposed downstream of the first region (152) and having a second diameter smaller than the first diameter. Between the first region (152) and the second region (154), an inclined region (153) may be disposed to connect the first region (152) and the second region (154). The region between the first region (152) and the second region (154) may be disposed within the first guide hole (430), which will be described later. The region between the first region (152) and the second region (154) may be arranged to overlap in a direction perpendicular to the optical axis with a region comprising one-half the height of the first guide hole (430), relative to the optical axis direction.

The outer surface of the first projection (150) may be plated. In one example, a plating area made of Ni, Ni+Sn may be formed on the outer surface of the first protrusion (150). Accordingly, a grounding structure may be implemented between the grounding region (450) of the printed circuit board (400, described later) and the first body (100).

Between the first protrusion (150) and the bottom surface of the first body (100), an escape groove (144) may be formed in a shape that is recessed upwardly from the other regions. The escape groove (144) may be disposed between the second protrusion (180) and a peripheral surface of the first protrusion (150). The escape groove (144) may have an arc-shaped cross-section. The escape groove (144) may be disposed on the outer side of the first region (152). The escape groove (144) allows a portion of the solder paste, such as lead, to be received so that the printed circuit board (400) and the first body (100) can be firmly bonded, and a clearance space from the top surface of the printed circuit board (400) can be provided to prevent tilting of the printed circuit board (400) with respect to the bottom surface of the second protrusion (180).

Meantime, a plurality of first guides (140) may be provided and spaced apart from each other along an edge of the first body (100). In one example, there may be four first guides (140), disposed at each corner region of the first body (100). The first body (100) may include a second guide (162). The second guide (162) may be formed to project downwardly from a bottom surface of the top plate (112), and may have an upwardly recessed coupling (engagement) groove (160) disposed in its center. In one example, the second guide (162) may be disposed between a plurality of first guides (140) disposed adjacent to each other. The second guides (162) may be formed to project inwardly from an inner surface of a region forming one side of an inner surface of the space within the first body (100). A bottom surface of the second guide (162) may form a plane coplanar with a bottom surface of the second protrusion (180).

The coupling groove (160) may be circular in cross-section, and allow the second body (200) to be engaged with the third guide (270). In the entrance region of the coupling groove (160), a slope (165) may be formed that tapers in cross-section upwardly to facilitate entry of the third guide (270) into the space within the coupling groove (160). The first body (100) may include a lens (300). The lens (300) may be disposed in the barrel portion (120). The lens (300) may be coupled to the barrel portion (120). The lens (300) may be disposed in a hole (121) of the barrel portion (120). The lens (300) may include a plurality of lenses (310). The plurality of lenses (310) may be housed in the barrel. The lens (300) may be aligned with an image sensor, as described later. The lens (300) may be optically aligned with the image sensor. The optical axis of the lens (300) may coincide with the optical axis of the image sensor. The first body (100) may include an infrared ray filter (IR filter) disposed between the lens (300) and the image sensor.

The outer surface of the lens (300) may be disposed with a protruding region (320) that projects outwardly. When the lens (300) and the first body (100) are combined, the protruding region (320) may be disposed on the top surface of the barrel portion (120). To prevent foreign objects from entering the space within the first body (100), a sealing member (not shown) may be disposed between the bottom surface of the protruding region (320) and the top surface of the barrel portion (120).

The camera module (10) may include a second body (200). The second body (200) may be named any one of a rear body, a lower housing, and a second housing. The second body (200) may be formed in a rectangular shape with an open top. The second body (200) may be formed of a metal material. The second body (200) may be disposed below the first body (100). The second body (200) may be coupled to the first body (100). The second body (200) may be coupled with the first body (100) to form an interior space. The second body (200) may include a space portion (207) having a top surface opening.

The second body (200) may include a bottom plate (202). The bottom plate (202) may be opposite the top plate (112) of the body portion (110) of the first body (100). The bottom plate (202) may be spaced apart from the top plate (112) of the body portion (110) of the first body (100) in an optical axis direction. The bottom plate (202) may be parallel to the top plate (112) of the body portion (110) of the first body (100). The bottom plate (202) may be formed in a rectangular shape. In this case, the corners of the bottom plate (202) may include a rounded shape at least in part.

The second body (200) may include a second side plate (204). The second side plate (204) may extend from the bottom plate (202). The second side plate (204) may extend from an outer edge of the bottom plate (202). A shield can (not shown) may be disposed on the second side plate (204). An inner surface of the second side plate (204) may be contacted by the shield can. A top of the second side plate (204) may be coupled to the first body (100). The top surface of the second side plate (204) may contact the underside of the first protrusion (132). An outer surface of the second side plate (204) may be disposed in the same plane as an outer surface of the first side plate (114) of the first body (100).

The second body (200) may include a connector lead portion (290). The connector lead portion (290) may be coupled to the bottom plate (202). The connector lead portion (290) may be disposed in a hole (not shown) in the bottom plate (202). The connector lead portion (290) may pass through a hole in the bottom plate (202). The connector lead portion (290) may have a connector (500) therein. The connector lead portion (290) may be formed of a metal material. When the first body (100) and second body (200) are joined, a portion of the top surface of the second side plate (204) may contact the underside of the first protrusion (132), and another portion of the top surface of the second side plate (204) may be arranged to overlap the first groove (134) in an optical axis direction. Accordingly, an epoxy-cured bonding area may be formed between the underside of the first protrusion (132) and the top surface of the second side plate (204), and between the first groove (134) and the top surface of the second side plate (204).

The second body (200) may include a third guide (270). The third guide (270) may be formed to project upwardly from a top surface of the bottom plate (202). The third guide (270) may be disposed to face the second guide (162) in an optical axis direction. The third guide (270) may include a third guide bodies (274, 276), and a second projection (272) that projects upwardly from a top surface of the third guide bodies (274, 276) and engages the coupling groove (160). The cross-sectional shape of the second projection (272) may be formed to correspond to the cross-sectional shape of the coupling groove (160).

The third guide body (274, 276) may have a plurality of regions with different cross-sectional areas. In one example, the third guide body (274, 276) may include a third-1 guide body (276) and a third-2 guide body (274). The cross-sectional area of the third-1 guide body (276) may be formed to be larger than the cross-sectional area of the third-2 guide body (274). The third-1 guide body (276) may be disposed at a lower portion of the third-2 guide body (274).

To increase the stiffness of the third guide (270), the second body (200) may include a reinforcement portion (280) connecting the third guide bodies (274, 276) to the inner surface of the second side plate (204). An optical axis length of the reinforcement portion (280) may correspond to an optical axis length of the third guide bodies (274, 276).

On the other hand, as described above, when the first body (100) and the second body (200) are joined, the assembly direction of the first body (100) and the second body (200) may be guided by the coupling structure of the second projection (272) and the coupling groove (160). Furthermore, the coupling structure of the second protrusion (272) and the coupling groove (160), which are disposed in a certain position, can prevent mis-assembly or mis-alignment when the printed circuit board (400) is placed.

The camera module (10) may include a printed circuit board (400). The printed circuit board (400) may be disposed between the first body (100) and the second body (200). A top surface of the printed circuit board (400) may contact a bottom surface of the second protrusion (180). The printed circuit board (400) may be disposed in the space portion (207) within the second body (200).

An image sensor (410) may be disposed on a top surface of printed circuit board (400). A connector (500) may be coupled to a bottom surface of the printed circuit board (400). The printed circuit board (400) may be electrically connected to the connector (500). A first guide hole (430) may be disposed in a region of the printed circuit board (400) that faces the first guide (140). The first guide hole (430) may be formed to extend downwardly from a top surface of the printed circuit board (400). The first guide hole (430) may be provided in a plurality, corresponding to a number and location of the first guide (140). In one example, the first guide hole (430) may be disposed in each corner region of the printed circuit board (400).

Thus, when coupling the first body (100) to the printed circuit board (400), the first protrusion (150) may be coupled to the first guide hole (430). The first projection (150) may be soldered to the first guide hole (430). Between the outer surface of the first projection (150) and the inner surface of the first guide hole (430), a solder portion (250) may be disposed in the forming region of the first guide hole (430) on the top and bottom of the printed circuit board (400). According to the above structure, parts such as screws for joining the printed circuit board (400) in the camera module (10) become unnecessary, and thus the number of parts can be reduced. Furthermore, since the solder portion (250) allows the bonding state of the first body (100) and the printed circuit board (400) to be firmly fixed, damage to the printed circuit board 400 by external impact can be prevented.

On the other hand, a grounding region (450) of the ground power source may be formed on the outer side of the first guide hole (430) among the upper and lower sides of the printed circuit board (400). Accordingly, a grounding structure of the first body (100) and the printed circuit board (400) may be implemented. In a region of the printed circuit board (400) that faces the second guide (162) or the third guide (270), a second guide hole (420) may be disposed. The second guide hole (420) may be formed to extend downwardly from the top surface of the printed circuit board (400). When viewed from the side, the second guide hole (420) may have a recessed shape that is more inwardly recessed than other areas. The second guide hole (420) may have a second projection (272) engaged to penetrate it. The second guide hole (420) may engage a lower portion of the second guide (162).

Thus, when the first body (100) and the printed circuit board (400) are joined via soldering, the coupling direction of the second body (200) may be guided primarily by the coupling structure between the connector (500) and the connector lead portion (290), and the coupling structure of the second guide hole (420), the coupling groove (160), and the second protrusion (272) may provide secondary guidance of the coupling of the second body (200).

According to the above structure, the first body, the second body, and the printed circuit board are electrically connected to form a ground region, so that electromagnetic waves generated in the circuit region of the printed circuit board can be prevented from radiating outward and affecting adjacent electronic components or from entering the printed circuit board, thereby further improving the electrical characteristics of the camera module and preventing the inclusion of noise in the electrical signals, resulting in an image of excellent quality. Furthermore, the printed circuit board and the first body are joined by soldering to thereby provide the advantage of reducing the manufacturing cost by reducing the number of components.

Although all of the components comprising embodiments of the present invention have been described above as combining or operating in combination, the present invention is not necessarily limited to these embodiments, i.e., all of the components may optionally operate in combination with one or more of the components, as long as they are within the scope of the present invention. Further, the terms "comprising," "consisting of," or "having" as used herein, unless specifically indicated to the contrary, are to be construed to mean that the components may be inherent in, and not to exclude, other components.

All terms, including technical or scientific terms, shall, unless otherwise defined, have the same meaning as commonly understood by one of ordinary skill in the art to which this invention belongs. Commonly used terms, such as dictionary-defined terms, are to be interpreted as consistent with their contextual meaning in the relevant art and are not to be construed in an idealized or overly formal sense unless expressly defined in the present invention.

The above description is merely an exemplary description of the technical ideas of the invention, and various modifications and variations will be apparent to one having ordinary skill in the technical field to which the invention belongs without departing from the essential features of the invention. Accordingly, the embodiments disclosed herein are intended to illustrate and not to limit the technical ideas of the invention, and the scope of the technical ideas of the invention is not limited by these embodiments. The scope of protection of the present invention shall be construed in accordance with the following claims, and all technical ideas within the scope of the equivalents shall be construed to be included in the scope of the present invention.

The invention claimed is:

1. A camera module comprising:

a first body comprising a lens;

a second body coupled to the first body; and a printed circuit board disposed between the first body and the second body, wherein the first body comprises a first guide protruding downward and comprising a first projection, and wherein the printed circuit board comprises a first guide hole to which the first projection is coupled, wherein the first guide is soldered to the first guide hole, wherein the first body includes a second protrusion projecting downwardly and contacting a top surface of the printed circuit board, wherein an escape groove is disposed between the second protrusion and the first guide, which is more recessed than in other areas, and wherein at least a portion of a solder paste is disposed in the escape groove.

2. The camera module of claim 1, wherein the first projection includes a first region having a first diameter and a second region having a second diameter smaller than the first diameter, and a region between the first region and the second region is disposed on an inner side of the first guide hole.

3. The camera module of claim 2, wherein an inclined region is disposed between the first region and the second region.

4. The camera module of claim 1, wherein the first guide and the first guide hole each are provided in plurality, and disposed in each corner region of the first body and the printed circuit board.

5. The camera module of claim 1, wherein the first body includes a second guide projecting downwardly and having an engagement groove formed in its center, and the second body includes a third guide projecting upwardly and engaging the second guide.

6. The camera module of claim 5, wherein a second guide hole is disposed on the printed circuit board facing the second guide and the third guide in which the second guide or the third guide is engaged.

7. The camera module of claim 5, wherein the second guide is disposed between a plurality of adjacent first guides.

8. The camera module of claim 5, comprising a reinforcement portion connecting a side plate of the second body and the third guide.

9. The camera module of claim 1, wherein an epoxy is disposed between the lower surface of the first body and the upper surface of the second body.

10. The camera module of claim 1, wherein a ground area for a ground power source is formed outside the first guide hole among an upper and lower surfaces of the printed circuit board.

11. The camera module of claim 1, comprising: a first protrusion protruding downward from a lower surface of the first body; and a first groove formed between the first protrusion and the second protrusion.

12. The camera module of claim 11, wherein an inner surface of the first groove is an inclined surface.

13. The camera module of claim 1, wherein a lower surface of the first projection is disposed lower than a lower surface of the printed circuit board.

14. A camera module comprising:

a first body including a top plate and a first side plate projecting downwardly from an edge of the top plate;

a second body including a bottom plate and a second side plate projecting upwardly from an edge of the bottom plate; and a printed circuit board disposed in a space within the second body, the first body including a first guide projecting downwardly from an edge of the top plate, the printed circuit board including a first guide hole of a ground power source to which the first guide is coupled, and the first guide being soldered to the first guide hole, wherein the first body includes a second protrusion projecting downwardly and contacting a top surface of the printed circuit board, wherein an escape groove is disposed between the second protrusion and the first guide, which is more recessed than in other areas, and wherein at least a portion of a solder paste is disposed in the escape groove.

15. The camera module of claim 14, wherein the first guide and the first guide hole each are provided in plurality, and disposed in each corner region of the first body and the printed circuit board.

16. The camera module of claim 14, wherein the first body includes a second guide projecting downwardly and having an engagement groove formed in its center, and the second body includes a third guide projecting upwardly and engaging the second guide.

* * * * *